United States Patent
Kimura (10) Patent No.: US 11,672,097 B2
(45) Date of Patent: Jun. 6, 2023

(54) ELECTRONIC DEVICE FOR AIRCRAFT AND METHOD OF ASSEMBLING THE SAME

(71) Applicant: NABTESCO CORPORATION, Tokyo (JP)

(72) Inventor: Hisanobu Kimura, Tokyo (JP)

(73) Assignee: NABTESCO CORPORATION, Tokyo (JP)

( * ) Notice: Subject to any disclaimer, the term of this patent is extended or adjusted under 35 U.S.C. 154(b) by 155 days.

(21) Appl. No.: 17/087,002

(22) Filed: Nov. 2, 2020

(65) Prior Publication Data

US 2021/0176882 A1    Jun. 10, 2021

(30) Foreign Application Priority Data

Dec. 4, 2019    (JP) ............................. JP2019-219454

(51) Int. Cl.
*H05K 7/14* (2006.01)
*B64F 5/10* (2017.01)

(52) U.S. Cl.
CPC ............. *H05K 7/1417* (2013.01); *B64F 5/10* (2017.01); *H05K 7/1427* (2013.01)

(58) Field of Classification Search
CPC ............................ H05K 7/1427; H05K 7/1417
See application file for complete search history.

(56) References Cited

U.S. PATENT DOCUMENTS

| | | | |
|---|---|---|---|
| 2,798,635 A | 7/1957 | Elkind | |
| 6,249,442 B1* | 6/2001 | Watanabe | H05K 7/142 361/752 |
| 6,429,547 B1* | 8/2002 | Muroi | H05K 1/141 307/66 |
| 9,844,140 B2* | 12/2017 | Oba | H05K 5/0052 |
| 9,952,461 B2* | 4/2018 | Nakazawa | G02F 1/1333 |
| 2006/0232948 A1* | 10/2006 | Haager | H05K 7/1417 361/752 |
| 2009/0122505 A1* | 5/2009 | Lu | H05K 1/0271 361/809 |
| 2009/0316372 A1* | 12/2009 | Kozlovski | H05K 7/1417 361/757 |

(Continued)

FOREIGN PATENT DOCUMENTS

| | | |
|---|---|---|
| JP | H09-283883 A | 10/1997 |
| JP | 2000-183567 A | 6/2000 |
| JP | 2007-242867 A | 9/2007 |

OTHER PUBLICATIONS

Extended European Search Report dated Apr. 23, 2021, issued in corresponding European Patent Application No. 20205421.9 (9 pgs.).

*Primary Examiner* — Rockshana D Chowdhury
*Assistant Examiner* — Douglas R Burtner
(74) *Attorney, Agent, or Firm* — Pillsbury Winthrop Shaw Pittman, LLP (57) ABSTRACT

An electronic device for an aircraft includes: a casing; a first boss projecting from a bottom wall of the casing toward an opening of the casing; a second boss projecting from the bottom wall of the casing toward the opening of the casing by a larger amount than the first boss; a first circuit board fixed to the first boss; and a second circuit board fixed to the second boss. The first circuit board includes cutouts penetrated by the second boss when the first circuit board is fixed to the first boss.

5 Claims, 5 Drawing Sheets

(56) References Cited

U.S. PATENT DOCUMENTS

| | | | |
|---|---|---|---|
| 2011/0235290 A1* | 9/2011 | Luhr | H05K 7/1417 |
| | | | 361/767 |
| 2017/0354047 A1* | 12/2017 | Okura | H05K 7/1427 |
| 2019/0104624 A1* | 4/2019 | Lin | H05K 7/1417 |
| 2022/0022333 A1* | 1/2022 | Oe | H04B 1/3827 |

* cited by examiner

ELECTRONIC DEVICE FOR AIRCRAFT AND METHOD OF ASSEMBLING THE SAME

CROSS-REFERENCE TO RELATED APPLICATIONS

This application is based on and claims the benefit of priority from Japanese Patent Application Serial No. 2019-219454 (filed on Dec. 4, 2019), the contents of which are hereby incorporated by reference in their entirety.

TECHNICAL FIELD

The present invention relates to an electronic device for an aircraft and a method of assembling the same.

BACKGROUND

In the electronic device disclosed in Japanese Patent Application Publication No. 2000-183567 ("the '567 Publication"), two circuit boards are housed in a casing shaped like a box having a bottom portion. One of the circuit boards is fixed to the bottom portion of the casing. A plurality of fixing pins project from the top surface of this circuit board. The other circuit board is mounted to the upper ends of the fixing pins. As a result, the two circuit boards are arranged in two stages, the upper stage and the lower stage.

In the '567 Publication, the upper circuit board is only connected to the lower circuit board via the fixing pins and is not fixed directly to the casing. Therefore, the upper circuit board may shake due to external vibration or the like.

SUMMARY

The present invention addresses such a drawback, and one object thereof is to fix each of a plurality of circuit boards positioned one over another to a casing.

An electronic device for an aircraft for achieving the above object comprises: a casing having an opening; at least one first boss projecting from a wall of the casing toward the opening of the casing; at least one second boss projecting from the wall of the casing toward the opening of the casing by a larger amount than the at least one first boss; a first circuit board fixed to the at least one first boss; and a second circuit board fixed to the at least one second boss, wherein the first circuit board has such a shape as to prevent interference with the at least one second boss when fixed to the at least one first boss.

In the above configuration, the at least one second boss can be prevented from interfering with the first circuit board, and therefore, each of the two circuit boards positioned one over another can be provided with a dedicated boss. Each of the circuit boards is fixed to the dedicated boss and thus is fixed to the casing.

In the electronic device for an aircraft, the at least one first boss may comprise a plurality of first bosses, and the at least one second boss may comprise a plurality of second bosses, the plurality of first bosses and the plurality of second bosses may be positioned at a periphery of the wall of the casing so as to alternate with each other in a direction along the periphery, and the shape of the first circuit board may include cutouts provided at a periphery of the first circuit board, and the cutouts may be penetrated by the plurality of second bosses when the first circuit board is fixed to the plurality of first bosses.

In the electronic device for an aircraft, the plurality of first bosses may be positioned at regular intervals in the direction along the periphery of the wall of the casing, and the plurality of second bosses may be positioned at regular intervals in the direction along the periphery of the wall of the casing.

In the electronic device for an aircraft, the casing may include a bottom wall and a side wall, the bottom wall constitutes the wall of the casing, and the side wall rises from a periphery of the bottom wall, and the plurality of first bosses and the plurality of second bosses may be formed integrally with the bottom wall and the side wall of the casing.

In the electronic device for an aircraft, the first circuit board and the second circuit board may have a quadrangular shape, and when the first circuit board is fixed to the at least one first boss and the second circuit board is fixed to the at least one second boss, four sides of the first circuit board and four sides of the second circuit board may fit each other in plan view from an opening side of the casing.

An electronic device for an aircraft for achieving the above object comprises: a casing having an opening; a plurality of first bosses projecting from a bottom wall of the casing toward the opening of the casing; a plurality of second bosses projecting from the bottom wall of the casing toward the opening of the casing by a larger amount than the plurality of first bosses; a first circuit board fixed to the plurality of first bosses; and a second circuit board fixed to the plurality of second bosses, wherein the plurality of first bosses and the plurality of second bosses are positioned at a periphery of the bottom wall of the casing so as to alternate with each other in a direction along the periphery, wherein the first circuit board has cutouts provided at a periphery thereof, and the cutouts are configured to prevent interference with the plurality of second bosses when the first circuit board is fixed to the plurality of first bosses, wherein the plurality of first bosses are positioned at regular intervals in the direction along the periphery of the bottom wall of the casing, wherein the plurality of second bosses are positioned at regular intervals in the direction along the periphery of the bottom wall of the casing, and wherein the casing includes a side wall rising from the periphery of the bottom wall, and the plurality of first bosses and the plurality of second bosses are formed integrally with the bottom wall and the side wall of the casing.

In the above configuration, the plurality of second bosses can be prevented from interfering with the first circuit board, and therefore, each of the two circuit boards positioned one over another can be provided with dedicated bosses. Each of the circuit boards is fixed to the dedicated bosses and thus is fixed to the casing.

In a method of assembling an electronic device for an aircraft for achieving the above object, the electronic device including: a casing having an opening; a first boss projecting from a wall of the casing toward the opening of the casing; a second boss projecting from the wall of the casing toward the opening of the casing by a larger amount than the first boss; a first circuit board fixed to the first boss; and a second circuit board fixed to the second boss, the first circuit board having such a shape as to prevent interference with the second boss when fixed to the first boss, the method comprises: a first fixing step of fixing the first circuit board to the first boss so as to prevent interference with the second boss, and a second fixing step of fixing the second circuit board to the second boss after the first fixing step.

In the above configuration, the second boss can be prevented from interfering with the first circuit board, and therefore, each of the two circuit boards positioned one over another is fixed to dedicated boss. Accordingly, each of the circuit boards can be fixed to the casing.

DESCRIPTION OF THE EMBODIMENTS

One embodiment of an aircraft actuator having an electronic device applied thereto will be hereinafter described with reference to the drawings.

Figure 1:
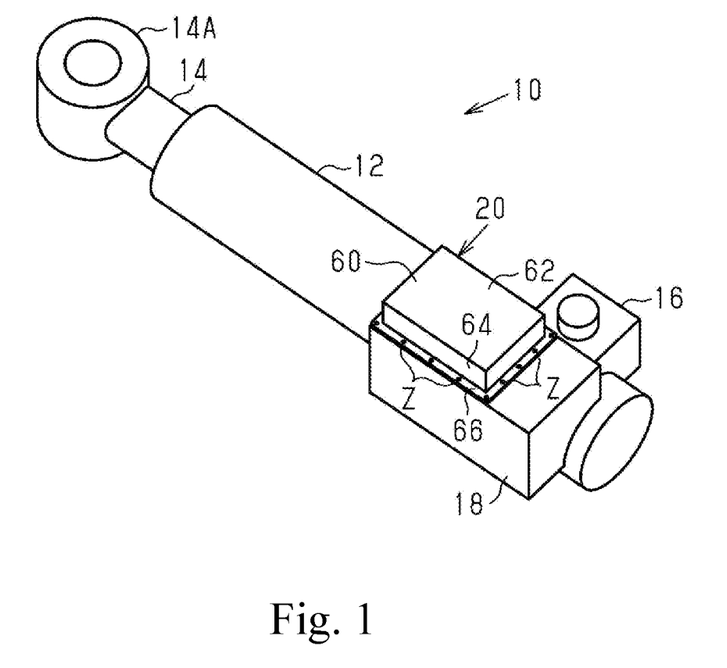
FIG. 1 is a perspective view of an aircraft actuator.

As shown in FIG. 1, an aircraft actuator 10 includes a cylinder 12 having a cylindrical shape. The interior of the cylinder 12 constitutes a fluid chamber for containing a hydraulic fluid which is fed into and discharged out of the fluid chamber. In the fluid chamber, a rod 14 having a columnar shape is positioned coaxially with the cylinder 12. The rod 14 reciprocates in the axial direction of the cylinder 12 in accordance with the hydraulic pressure of the hydraulic fluid. A part of the distal end side of the rod 14 projects from one end of the cylinder 12. The distal end portion of the rod 14 forms a mounting portion 14A to which an operating object to be operated by the aircraft actuator 10 is mounted. The mounting portion 14A has an annular shape. The operating object is a flap of an aircraft. Although not shown, the other end portion of the cylinder 12 forms a mounting portion for engaging with a mounting object to which the aircraft actuator 10 is mounted. The mounting object is a main wing of the aircraft.

A manifold 16 is fixed to the outer surface of the cylinder 12. The manifold 16 contains a hydraulic circuit defined therein. The hydraulic circuit includes a solenoid valve or the like for switching the flow path in the hydraulic circuit. The hydraulic fluid in the hydraulic circuit is fed into and discharged out of the cylinder 12. Also, an electrical equipment box 18 is fixed to the outer surface of the cylinder 12. The electrical equipment box 18 has a container space defined therein. The electrical equipment box 18 is spaced apart from the manifold 16. The container space of the electrical equipment box 18 contains wires leading to the solenoid valve in the hydraulic circuit. An electronic device 20 is fixed to the outer surface of the electrical equipment box 18.

Figure 2:
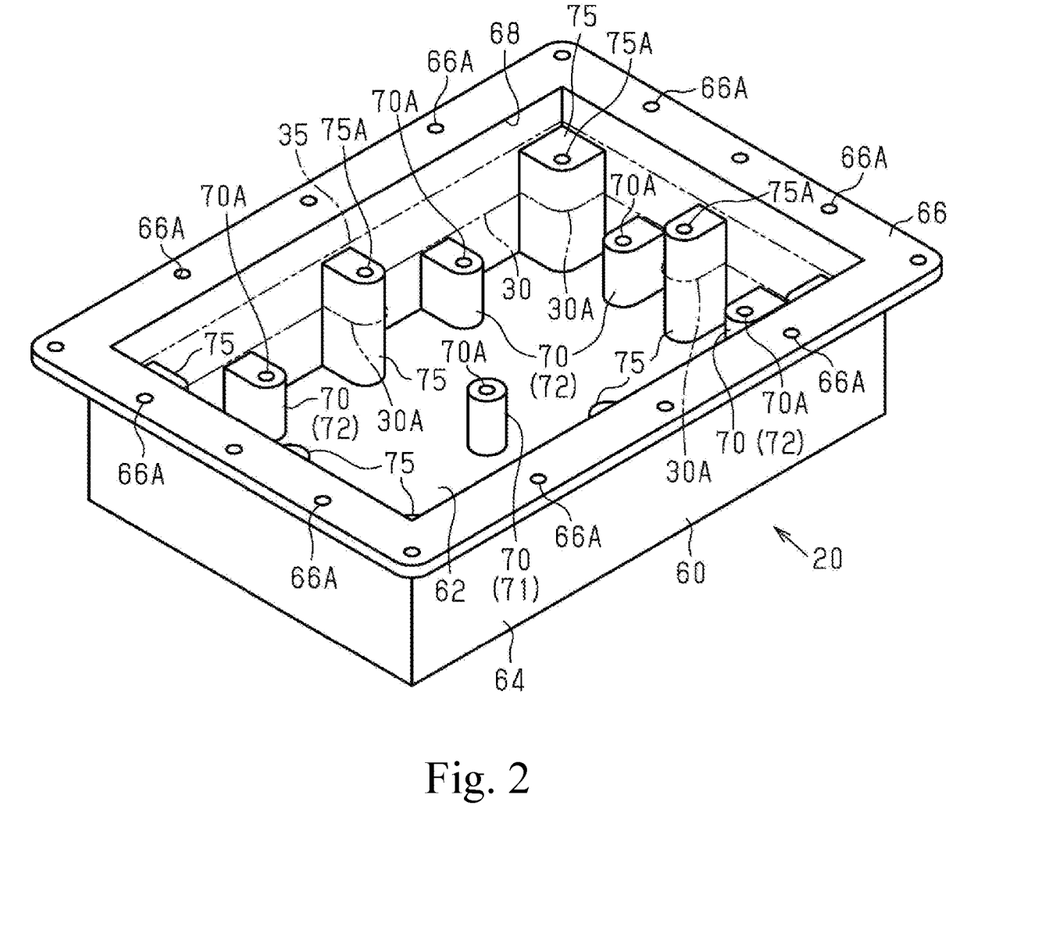
FIG. 2 is a perspective view of an electronic device.

As shown in FIG. 2, the electronic device 20 includes a casing 60 that forms the contour of the electronic device 20. The casing 60 is shaped like a quadrangular box having an opening 68 and a bottom. Specifically, the casing 60 has a bottom wall 62 shaped like a rectangular flat plate in plan view. A side wall 64 rises from the periphery of the bottom wall 62. The side wall 64 extends over the whole stretch of the periphery of the bottom wall 62. The side wall 64 rises the same length over the whole stretch of the periphery of the bottom wall 62. The distal end of the side wall 64 in its rising direction as a whole forms an edge of the quadrangular opening 68. A flange 66 projects outward from the distal end of the side wall 64 in its rising direction. The flange 66 extends over the whole stretch of the side wall 64. The flange 66 is penetrated by a plurality of through-holes 66A in the thickness direction thereof.

As shown in FIG. 1, the casing 60 is fixed to the electrical equipment box 18, with the flange 66 thereof contacting with the outer surface of the electrical equipment box 18. Each of the through-holes 66A in the flange 66 is penetrated by a bolt Z. The bolt Z is fastened to the electrical equipment box 18.

As shown in FIG. 2, a plurality of first bosses 70 project from the bottom wall 62 toward the opening 68 of the casing 60. Each of the first bosses 70 is shaped like a pillar and rises perpendicularly from the bottom wall 62. All the first bosses 70 project by the same amount. Each of the first bosses 70 has a bolt hole 70A extending from the distal end surface thereof toward the bottom wall 62.

Figure 3:
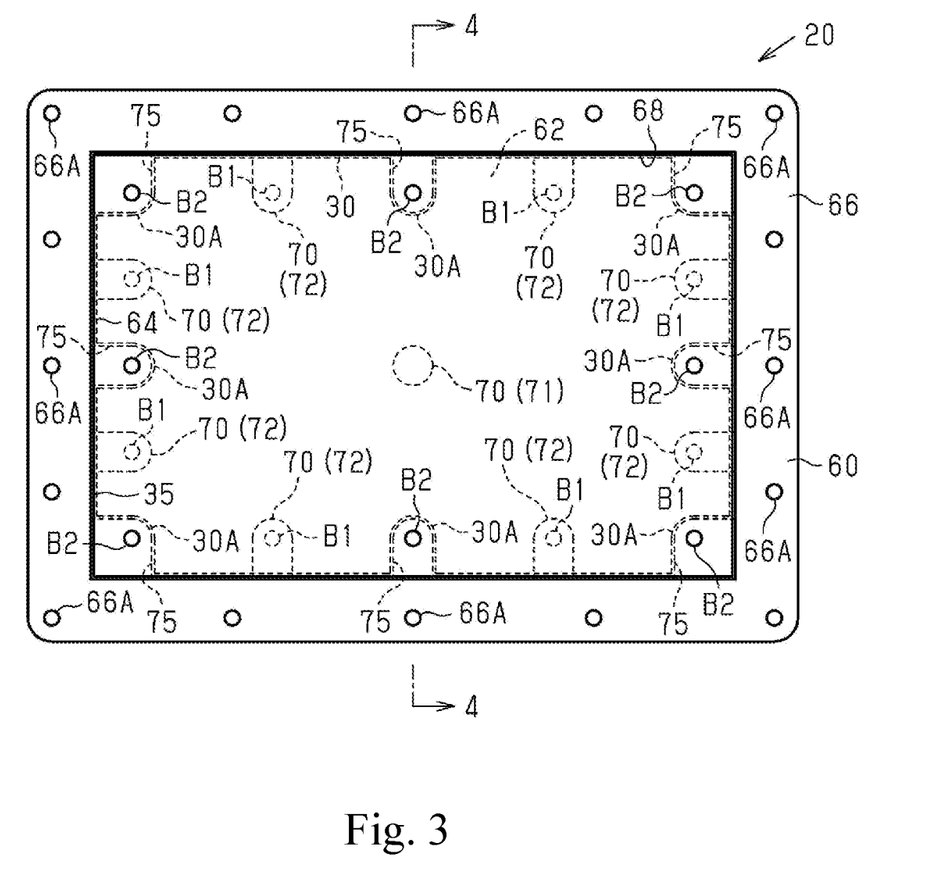
FIG. 3 is a plan view of the electronic device as viewed from an opening side of a casing.

As shown in FIG. 3, a central first boss 71, which is one of the first bosses 70, is positioned at the centroid of the rectangle of the bottom wall 62. The rest of the first bosses 70, referred to as outer first bosses 72, are positioned at outer portions of the bottom wall 62. Specifically, the outer first bosses 72 are positioned at the periphery of the bottom wall 62. As shown in FIG. 2, the outer first bosses 72 are formed integrally with the bottom wall 62 and the side wall 64, and thus are connected with the side wall 64 as well as the bottom wall 62. As shown in FIG. 3, the outer first bosses 72 are provided two per side of the rectangle of the bottom wall 62. For each side of the rectangle of the bottom wall 62, the two outer first bosses 72 provided on the side are arranged such that the middle of the side is positioned between them.

Figure 4:
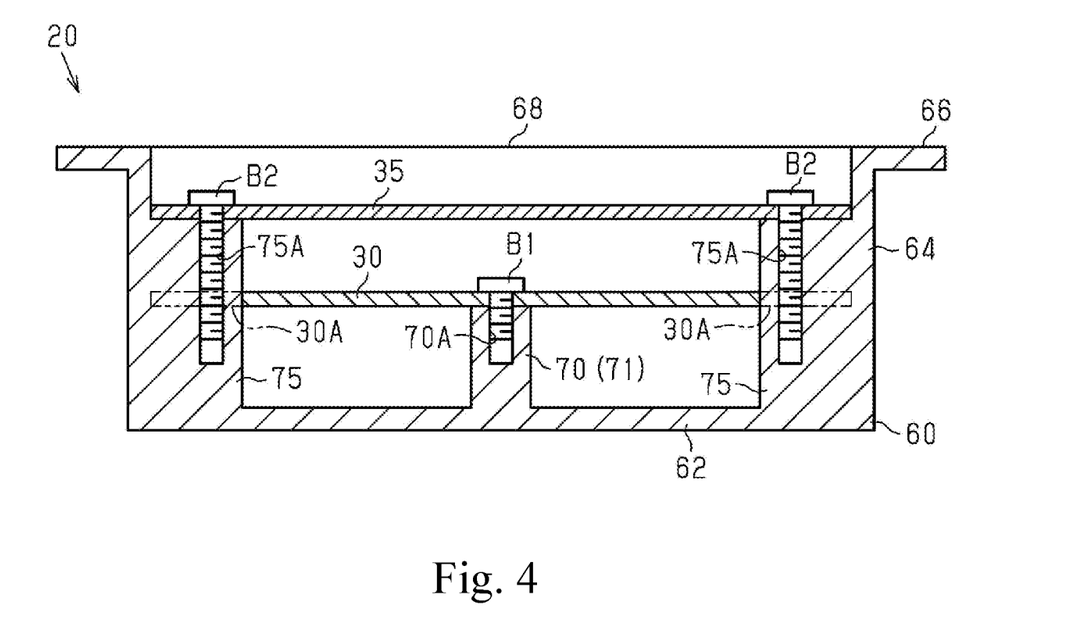
FIG. 4 is a sectional view along the direction 4-4 in FIG. 3.

As shown in FIGS. 2 and 4, a plurality of second bosses 75 project from the bottom wall 62 toward the opening 68 of the casing 60. Each of the second bosses 75 is shaped like a pillar and rises perpendicularly from the bottom wall 62. All the second bosses 75 project by the same amount. Specifically, the amount of projection of the second bosses 75 is larger than that of the first bosses 70 and is smaller than the rise length of the side wall 64. Each of the second bosses 75 has a bolt hole 75A extending from the distal end surface thereof toward the bottom wall 62.

As shown in FIG. 3, the second bosses 75 are positioned at outer portions of the bottom wall 62. Specifically, the second bosses 75 are positioned at the periphery of the bottom wall 62. As shown in FIG. 2, the second bosses 75 are formed integrally with the bottom wall 62 and the side wall 64, and thus are connected with the side wall 64 as well as the bottom wall 62. As shown in FIG. 3, the second bosses 75 are provided one per corner of the rectangle of the bottom wall 62 and also provided one per side of the rectangle at the middle thereof. In other words, the second bosses 75 alternate with the outer first bosses 72 in the direction along the periphery of the bottom wall 62. For each side of the rectangle of the bottom wall 62, the intervals between adjacent ones of the outer first bosses 72 and the second bosses 75 are the same.

Figure 5:
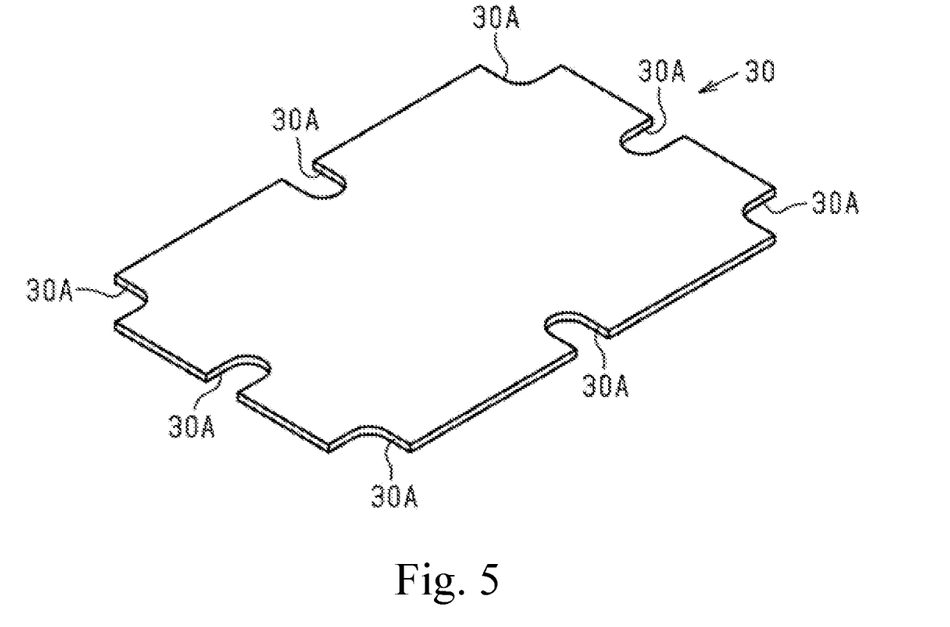
FIG. 5 is a perspective view of a first circuit board.

As shown in FIG. 4, the casing 60 contains a first circuit board 30 shaped like a plate. As shown in FIG. 3, the first circuit board 30 has a rectangular shape. The outer dimensions of the first circuit board 30 are substantially the same as those of the bottom wall 62 of the casing 60, and specifically, the outer dimensions of the first circuit board 30 are slightly smaller than those of the bottom wall 62. As shown in FIG. 5, the first circuit board 30 is penetrated by a plurality of cutouts 30A in the thickness direction thereof. The cutouts 30A are positioned at outer portions of the first circuit board 30. Specifically, the cutouts 30A have such a shape that are cut from the periphery toward the center of the first circuit board 30. The cutouts 30A are provided one per corner of the rectangle of the first circuit board 30 and also provided one per side of the rectangle at the middle thereof.

As shown in FIG. 3, the first circuit board 30 is contained in the casing 60, with the four sides of the first circuit board 30 fitting the four sides of the bottom wall 62 of the casing 60 in plan view from the opening 68 side of the casing 60. Specifically, a gap is present between the side wall 64 and the first circuit board 30. Since the outer dimensions of the first circuit board 30 are approximate to those of the bottom wall 62 of the casing 60, the positions of the cutouts 30A of the first circuit board 30 correspond to those of the second bosses 75 in plan view from the opening 68 side of the casing 60. In plan view from the opening 68 side of the casing 60, each of the cutouts 30A has such a size as to fit the second boss 75 at the corresponding position.

As shown in FIGS. 2 and 4, each of the cutouts 30A is penetrated by the corresponding second boss 75. The first circuit board 30 is placed on the distal end surfaces of the first bosses 70, with each of the cutouts 30A being penetrated by the corresponding second boss 85. The first circuit board 30 is fixed to the first bosses 70 with first bolts B1 each corresponding to one of the first bosses 70. The first bolts B1 penetrate the first circuit board 30 in the thickness direction thereof and is fastened into the bolt holes 70A in the first bosses 70. In this way, the first circuit board 30 is fixed to the first bosses 70 such that the cutouts 30A prevent the first circuit board 30 from interfering with the second bosses 75.

The casing 60 contains a second circuit board 35 shaped like a plate. The second circuit board 35 has a rectangular shape. As shown in FIG. 3, the outer dimensions of the second circuit board 35 is substantially the same as those of the first circuit board 30. The second circuit board 35 is positioned such that the four sides of the second circuit board 35 fit the four sides of the first circuit board 30 in plan view from the opening 68 side of the casing 60. In other words, the first circuit board 30 and the second circuit board 35 are positioned one over another so as to completely fit each other in plan view from the opening 68 side of the casing 60. As with the first circuit board 30, a gap is present between the side wall 64 and the second circuit board 35.

As shown in FIGS. 2 and 4, the second bosses 75 penetrate the cutouts 30A of the first circuit board 30 and project beyond the first circuit board 30 toward the opening 68 of the casing 60. The second circuit board 35 is fixed to the distal end surfaces of the second bosses 75 with second bolts B2 each corresponding to one of the second bosses 75. The second bolts B2 penetrate the second circuit board 35 in the thickness direction thereof and is fastened into the bolt holes 75A in the second bosses 75. Although not shown, various electronic components are mounted on the first circuit board 30 and the second circuit board 35, and wires run from these electronic components into the electrical equipment box 18.

Next, a description is given of a method of assembling the electronic device 20. Suppose that the electronic device 20 is detached from the electrical equipment box 18. Also suppose that the first circuit board 30 and the second circuit board 35 are detached out of the casing 60.

Assembling the electronic device 20 starts with a first fixing step, in which the first circuit board 30 is placed on the distal end surfaces of the first bosses 70 such that the cutouts 30A of the first circuit board 30 are penetrated by the second bosses 75. The first circuit board 30 is then fixed to the distal end surfaces of the first bosses 70 with the first bolts B1. The first fixing step is followed by a second fixing step, in which the second circuit board 35 is placed on the distal end surfaces of the second bosses 75. The second circuit board 35 is then fixed to the second bosses 75 with the second bolts B2. Subsequently, the casing 60 is fixed to the electrical equipment box 18.

Advantageous effects of the embodiment will be now described.

(1) The first circuit board 30 and the second circuit board 35 have substantially the same outer dimensions as the bottom wall 62, such that the first circuit board 30 and the second circuit board 35, which are disposed in parallel with the bottom wall 62 in the casing 60, can have the maximum outer dimensions. Since the first circuit board 30 and the second circuit board 35 have the maximum outer dimensions, the first circuit board 30 and the second circuit board 35 are positioned to fit each other. In this arrangement, the positions of the second bosses 75 for fixing the second circuit board 35 are naturally within the region of the first circuit board 30 in plan view from the opening 68 side of the casing 60. In the embodiment, the cutouts 30A are provided in the first circuit board 30 at the positions corresponding to those of the second bosses 75 in plan view from the opening 68 side of the casing 60. When the first circuit board 30 is contained in the casing 60, the second bosses 75 penetrate the cutouts 30A and project beyond the first circuit board 30 toward the opening 68 of the casing 60. In this way, the cutouts 30A provided in the first circuit board 30 prevent the second bosses 75 from interfering with the first circuit board 30. Therefore, the first circuit board 30 and the second circuit board 35, which are positioned one over another so as to completely fit each other, can be provided with dedicated bosses. Accordingly, with these dedicated bosses, both the first circuit board 30 and the second circuit board 35 can be fixed to the casing 60.

(2) In the '567 Publication, one of the two circuit boards is fixed to the casing, while the other is connected to the first one via fixing pins. In this arrangement, the other circuit board includes no portion fixed to the casing that serves as a ground, and therefore, another arrangement is necessary for connection to the ground. With this respect, the present embodiment is configured such that the first circuit board 30 and the second circuit board 35 are fixed to the first bosses 70 and the second bosses 75 dedicated thereto, respectively, which project from the bottom wall 62 of the casing 60. Accordingly, the first circuit board 30 is connected via the first bosses 70 to the casing 60 that serves as a ground, and the second circuit board 35 is also connected via the second bosses 75 to the casing 60 that serves as a ground. The first circuit board 30 and the second circuit board 35 are thus connected to the ground without need of a special arrangement for connection to the ground.

(3) The outer first bosses 72 and the second bosses 75 are positioned at outer portions of the bottom wall 62 of the casing 60. Therefore, a large proportion of the inner space of the casing 60 can be unoccupied, instead of being occupied by the first bosses 70 and the second bosses 75. Besides, the cutouts 30A are provided at outer portions of the first circuit board 30 to prevent interference with the second bosses 75. Therefore, the first circuit board 30 does not interfere with the second bosses 75.

(4) The first bosses 70 are provided on each of the four sides of the rectangle defined by the bottom wall 62 of the casing 60, as well as at the centroid of the rectangle defined by the bottom wall 62. Therefore, the four sides of the first circuit board 30 are equally fixed to the casing 60. This prevents a force caused by external vibration from acting locally in the first circuit board 30.

Likewise, the second bosses 75 are provided on each of the four sides of the rectangle defined by the bottom wall 62 of the casing 60, as well as at each of the four corners of the rectangle defined by the bottom wall 62 of the casing 60. Therefore, the four sides of the second circuit board 35 are equally fixed to the casing 60. This prevents a force caused by external vibration from acting locally in the second circuit board 35.

(5) The first bosses 70 and the second bosses 75 are formed integrally with the bottom wall 62 and the side wall 64. Therefore, the first bosses 70 and the second bosses 75 have a high rigidity. This prevents the first bosses 70 and the second bosses 75 from shaking or cracking due to external vibration.

The above embodiment can be modified as described below. The above embodiment and the following modifications can be implemented in combination to the extent where they are technically consistent with each other.

The shape of the casing 60 is not limited to that in the above embodiment. The casing 60 can have any shape with an opening. The casing 60 is not limited to the quadrangular box-like shape but may have a circular box-like shape, or in other words, a cylindrical shape with one end thereof closed, or a polygonal box-like shape other than a quadrangle. The bottom wall 62 is not limited to the plate-like shape but may be curved. The side wall 64 may rise obliquely so as to diverge toward the opening 68. In the arrangement in which the side wall 64 rises obliquely so as to diverge toward the opening 68, the outer dimensions of the opening 68 are larger than those of the bottom wall 62. In this arrangement, when the first circuit board 30 and the second circuit board 35 have the same outer dimensions, the gap between the second circuit board 35 positioned on the opening 68 side and the side wall 64 is larger than the gap between the first circuit board 30 positioned on the bottom wall 62 side and the side wall 64. In this way, the gap between the first circuit board 30 and the side wall 64 and the gap between the second circuit board 35 and the side wall 64 may have different dimensions, depending on the shape of the casing 60.

The casing may alternatively have a rounded shape in which the bottom wall and the side wall are curved smoothly and continuous to each other and no boundary is present between the bottom wall and the side wall. In such a casing, the first bosses and the second bosses may project from the bottom-side wall of the casing toward the opening of the casing.

The number of the first bosses 70 is not limited to that in the above embodiment. One or more first bosses 70 are provided.

The positions of the first bosses 70 are not limited to those in the above embodiment. All of the first bosses 70 may alternatively be positioned away from the periphery of the bottom wall 62 of the casing 60, or positioned close to the center of the bottom wall 62.

The number of the second bosses 75 is not limited to that in the above embodiment. One or more second bosses 75 are provided.

The positions of the second bosses 75 are not limited to those in the above embodiment. The second bosses 75 may alternatively be positioned away from the periphery of the bottom wall 62. If the number or the positions of the second bosses 75 are changed, the number or the positions of the cutouts 30A in the first circuit board 30 are also changed. The cutouts 30A are provided in the first circuit board 30 at the positions corresponding to those of the second bosses 75 in plan view from the opening 68 side of the casing 60. Depending on the positions of the second bosses 75, the cutouts 30A may be positioned away from the periphery of the first circuit board 30, or positioned close to the center of the first circuit board 30.

If the numbers or the positions of the first bosses 70 and the second bosses 75 are changed, it is also possible that the first bosses 70 and the second bosses 75 do not alternate with each other in the direction along the periphery of the bottom wall 62 of the casing 60.

The first bosses 70 may alternatively be positioned at regular intervals in the direction along the periphery of the bottom wall 62 over the whole stretch of the periphery of the bottom wall 62 of the casing 60. Further, the second bosses 75 may alternatively be positioned at regular intervals in the direction along the periphery of the bottom wall 62 over the whole stretch of the periphery of the bottom wall 62 of the casing 60. In this arrangement, the whole stretch of the periphery of the first circuit board 30 is equally fixed to the casing 60. Accordingly, the first circuit board 30 can be retained stably. The same applies to the second circuit board 35. It is also possible that only the first bosses 70 or the second bosses 75 are positioned at regular intervals along the periphery of the bottom wall 62 of the casing 60.

It is not necessary that the first bosses 70 are connected to the side wall 64 of the casing 60. It is thus possible that the first bosses 70 are not formed integrally with the side wall 64. The same applies to the second bosses 75.

It is possible that the first bosses 70 and the second bosses 75 are previously formed separate from the bottom wall 62 of the casing 60 and then attached to the bottom wall 62 with an adhesive or the like. In other words, it is possible that the first bosses 70 and the second bosses 75 are not formed integrally with the bottom wall 62.

The outer dimensions of the first circuit board 30 and the second circuit board 35 can be modified as necessary. The first circuit board 30 and the second circuit board 35 may have different outer dimensions. For example, when the side wall 64 rises obliquely so as to diverge toward the opening 68, as described for the above modification, it is possible that the second circuit board 35 has larger outer dimensions than the first circuit board 30 such that gaps of the same width are formed between the side wall 64 and the both circuit boards 30, 35.

The shapes of the first circuit board 30 and the second circuit board 35 can be modified as necessary. The first circuit board 30 may have a polygonal shape other than a quadrangle or a circular shape. The same applies to the shape of the second circuit board 35. The first circuit board 30 and the second circuit board 35 may have different shapes.

It is possible that three or more circuit boards are fixed to the casing 60. For example, another circuit board is disposed closer to the opening 68 of the casing 60 than the second circuit board 35 is. Bosses dedicated to this circuit board project from the bottom wall 62 of the casing 60. In this arrangement, cutouts penetrated by the bosses dedicated to this circuit board are provided in the first circuit board 30 and the second circuit board 35. Additional circuit boards may be provided in the same manner.

A plate-shaped lid may be provided on the opening 68 of the casing 60.

Operating objects other than a flap may be mounted to the aircraft actuator 10 having the electronic device 20 attached thereto. The operating object may be an aileron, a rudder, or an elevator. The cylinder may be mounted to different mounting objects in accordance with the operating object.

The electronic device 20 may be attached to different types of aircraft actuators 10 other than those using the hydraulic fluid. Examples of such aircraft actuators include those configured to convert a rotational motion of a motor into a linear motion and transmit the linear motion to a rod. This type of actuators include an electrical equipment box containing wires leading to the motor. The electronic device 20 may be attached to this electrical equipment box.

The electronic device 20 may be attached to components other than the electrical equipment box 18. The electronic device 20 may be attached to any components in the aircraft actuator 10 other than the electrical equipment box 18, or it may be attached to components in any constituents other than the aircraft actuator 10. The electronic device 20 may be attached to any components installed on an aircraft. However, when the electronic device 20 is attached to a component heating to a very high temperature such as the manifold 16, the first circuit board 30 and the second circuit board 35 may overheat. Therefore, the electronic device 20 is preferably attached to a component not heating to an excessively high temperature.

Other Embodiments

The following numbered examples are embodiments.
1. An electronic device for an aircraft, comprising:
a casing having an opening;
a plurality of first bosses projecting from a bottom wall of the casing toward the opening of the casing;
a plurality of second bosses projecting from the bottom wall of the casing toward the opening of the casing by a larger amount than the plurality of first bosses;
a first circuit board fixed to the plurality of first bosses; and
a second circuit board fixed to the plurality of second bosses,
wherein the plurality of first bosses and the plurality of second bosses are positioned at a periphery of the bottom wall of the casing so as to alternate with each other in a direction along the periphery,
wherein the first circuit board has cutouts provided at a periphery thereof, and the cutouts are configured to prevent interference with the plurality of second bosses when the first circuit board is fixed to the plurality of first bosses,
wherein the plurality of first bosses are positioned at regular intervals in the direction along the periphery of the bottom wall of the casing,
wherein the plurality of second bosses are positioned at regular intervals in the direction along the periphery of the bottom wall of the casing, and
wherein the casing includes a side wall rising from the periphery of the bottom wall, and the plurality of first bosses and the plurality of second bosses are formed integrally with the bottom wall and the side wall of the casing.

What is claimed is:
1. An electronic device for an aircraft, comprising:
a casing having an opening;
at least one first boss projecting from a wall of the casing toward the opening of the casing;
at least one second boss projecting from the wall of the casing toward the opening of the casing by a larger amount than the at least one first boss;
a first circuit board fixed to the at least one first boss; and
a second circuit board fixed to the at least one second boss,
wherein the first circuit board has such a shape as to prevent interference with the at least one second boss when fixed to the at least one first boss,
wherein the casing includes a bottom wall and a side wall, the bottom wall constitutes the wall of the casing, and the side wall rises from a periphery of the bottom wall,
wherein the plurality of first bosses and the plurality of second bosses are formed integrally with the bottom wall and the side wall of the casing, and
wherein the plurality of first bosses and the plurality of second bosses are directly connected with the bottom wall and the side wall.

2. The electronic device for an aircraft according to claim 1, wherein the at least one first boss comprises a plurality of first bosses, and the at least one second boss comprises a plurality of second bosses,
wherein the plurality of first bosses and the plurality of second bosses are positioned at a periphery of the wall of the casing so as to alternate with each other in a direction along the periphery, and
wherein the shape of the first circuit board includes cutouts provided at a periphery of the first circuit board, and the cutouts are penetrated by the plurality of second bosses when the first circuit board is fixed to the plurality of first bosses.

3. The electronic device for an aircraft according to claim 2, wherein the plurality of first bosses are positioned at regular intervals in the direction along the periphery of the wall of the casing, and
wherein the plurality of second bosses are positioned at regular intervals in the direction along the periphery of the wall of the casing.

4. The electronic device for an aircraft according to claim 1, wherein the first circuit board and the second circuit board have a quadrangular shape, and
wherein when the first circuit board is fixed to the at least one first boss and the second circuit board is fixed to the at least one second boss, four sides of the first circuit board and four sides of the second circuit board fit each other in plan view from an opening side of the casing.

5. A method of assembling an electronic device for an aircraft, the electronic device including:
a casing having an opening;
a first boss projecting from a wall of the casing toward the opening of the casing;
a second boss projecting from the wall of the casing toward the opening of the casing by a larger amount than the first boss;
a first circuit board fixed to the first boss; and
a second circuit board fixed to the second boss,
wherein the casing includes a bottom wall and a side wall, the bottom wall constitutes the wall of the casing, and the side wall rises from a periphery of the bottom wall,
wherein the plurality of first bosses and the plurality of second bosses are formed integrally with the bottom wall and the side wall of the casing, and
wherein the plurality of first bosses and the plurality of second bosses are directly connected with the bottom wall and the side wall,
the first circuit board having such a shape as to prevent interference with the second boss when fixed to the first boss, the method comprising:
a first fixing step of fixing the first circuit board to the first boss so as to prevent interference with the second boss, and
a second fixing step of fixing the second circuit board to the second boss after the first fixing step.

* * * * *